US008648386B2

(12) United States Patent
Chen et al.

(10) Patent No.: US 8,648,386 B2
(45) Date of Patent: Feb. 11, 2014

(54) SEMICONDUCTOR STRUCTURE AND MANUFACTURING METHOD FOR THE SAME AND ESD CIRCUIT

(75) Inventors: Hsin-Liang Chen, Taipei (TW); Wing-Chor Chan, Hsinchu (TW); Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/222,187

(22) Filed: Aug. 31, 2011

(65) Prior Publication Data

US 2013/0049067 A1  Feb. 28, 2013

(51) Int. Cl.
  *H01L 27/07*  (2006.01)
(52) U.S. Cl.
  USPC ............... 257/173; 257/539; 257/E27.037; 257/E21.37; 257/E29.181
(58) Field of Classification Search
  USPC .......................... 257/173, E29.181
  See application file for complete search history.

(56) References Cited

U.S. PATENT DOCUMENTS

| 5,272,371 | A | * | 12/1993 | Bishop et al. | 257/362 |
| 5,430,595 | A | * | 7/1995 | Wagner et al. | 361/56 |
| 6,521,952 | B1 | * | 2/2003 | Ker et al. | 257/360 |
| 6,639,283 | B1 | * | 10/2003 | Hung et al. | 257/355 |
| 6,770,938 | B1 | * | 8/2004 | Fliesler et al. | 257/357 |
| 7,064,358 | B2 | * | 6/2006 | Manna et al. | 257/173 |
| 7,786,507 | B2 | | 8/2010 | Denison et al. | |
| 7,800,127 | B1 | * | 9/2010 | Vashchenko et al. | 257/173 |
| 8,253,203 | B2 | * | 8/2012 | Jin | 257/361 |
| 8,338,915 | B2 | * | 12/2012 | Mallikararjunaswamy et al. | 257/577 |
| 2003/0035257 | A1 | | 2/2003 | Chen | |
| 2003/0042498 | A1 | * | 3/2003 | Ker et al. | 257/173 |
| 2005/0280092 | A1 | | 12/2005 | Cheng et al. | |
| 2008/0029782 | A1 | * | 2/2008 | Carpenter et al. | 257/173 |
| 2008/0296613 | A1 | * | 12/2008 | Chuang | 257/173 |
| 2009/0166671 | A1 | * | 7/2009 | Hwang | 257/137 |
| 2009/0166721 | A1 | | 7/2009 | Denison et al. | |
| 2009/0230426 | A1 | * | 9/2009 | Carpenter et al. | 257/173 |

(Continued)

FOREIGN PATENT DOCUMENTS

| TW | 484177 | 4/2002 |
| TW | 200847428 | 12/2008 |
| TW | 201108383 A1 | 3/2011 |

OTHER PUBLICATIONS

English language translation of abstract of TW 484177 (published Apr. 21, 2002).

(Continued)

*Primary Examiner* — Chuong A Luu
*Assistant Examiner* — Jaehwan Oh
(74) *Attorney, Agent, or Firm* — McClure, Qualey & Rodack, LLP

(57) ABSTRACT

A semiconductor structure and manufacturing method for the same, and an ESD circuit are provided. The semiconductor structure comprises a first doped region, a second doped region, a third doped region and a resistor. The first doped region has a first type conductivity. The second doped region has a second type conductivity opposite to the first type conductivity. The third doped region has the first type conductivity. The first doped region and the third doped region are separated by the second doped region. The resistor is coupled between the second doped region and the third doped region. An anode is coupled to the first doped region. A cathode is coupled to the third doped region.

18 Claims, 9 Drawing Sheets

(56) References Cited

U.S. PATENT DOCUMENTS

| | | | |
|---|---|---|---|
| 2010/0103570 A1* | 4/2010 | Song et al. | 361/56 |
| 2010/0109043 A1 | 5/2010 | Wang et al. | |
| 2010/0171149 A1* | 7/2010 | Denison et al. | 257/173 |
| 2011/0096446 A1* | 4/2011 | Croft | 361/56 |
| 2013/0032862 A1* | 2/2013 | Su et al. | 257/272 |

OTHER PUBLICATIONS

TW Office Action dated Aug. 23, 2013.

* cited by examiner

SEMICONDUCTOR STRUCTURE AND MANUFACTURING METHOD FOR THE SAME AND ESD CIRCUIT

BACKGROUND

1. Technical Field

The disclosure relates in general to a semiconductor structure and a manufacturing method for the same, and more particularly to an ESD circuit.

2. Description of the Related Art

The electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor integrated circuit, the semiconductor integrated circuit is usually damaged. Thus, the ESD protection device between power lines has to provide a discharge path to prevent the semiconductor integrated circuit from being damaged when the high-voltage (HV) electrostatic charges are generated in the semiconductor integrated circuit.

SUMMARY

A semiconductor structure is provided. The semiconductor structure comprises a first doped region, a second doped region, a third doped region and a resistor. The first doped region has a first type conductivity. The second doped region has a second type conductivity opposite to the first type conductivity. The third doped region has the first type conductivity. The first doped region and the third doped region are separated by the second doped region. The resistor is coupled between the second doped region and the third doped region. An anode is coupled to the first doped region. A cathode is coupled to the third doped region.

A manufacturing method for a semiconductor structure is provided. The method comprises following steps. A first doped region having a first type conductivity is formed in a substrate. A second doped region having a second type conductivity opposite to the first type conductivity is formed in the substrate. A third doped region having the first type conductivity is formed in the second doped region. The first doped region and the third doped region are separated by the second doped region. A field plate structure is formed on the second doped region.

An ESD circuit is provided. The circuit comprises a first BJT and a resistor. The resistor is coupled between a base and an emitter of the first BJT.

DETAILED DESCRIPTION

Figure 1:
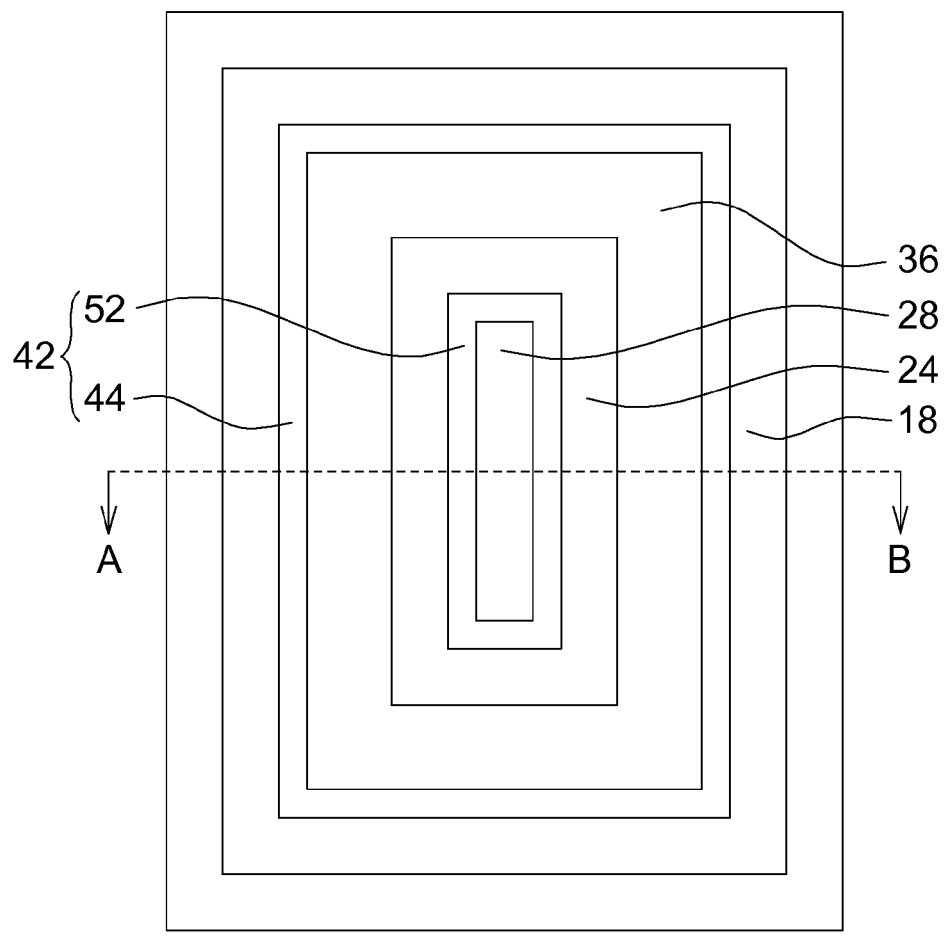
FIG. 1 illustrates a top view of a semiconductor structure in one embodiment.
Figure 2:
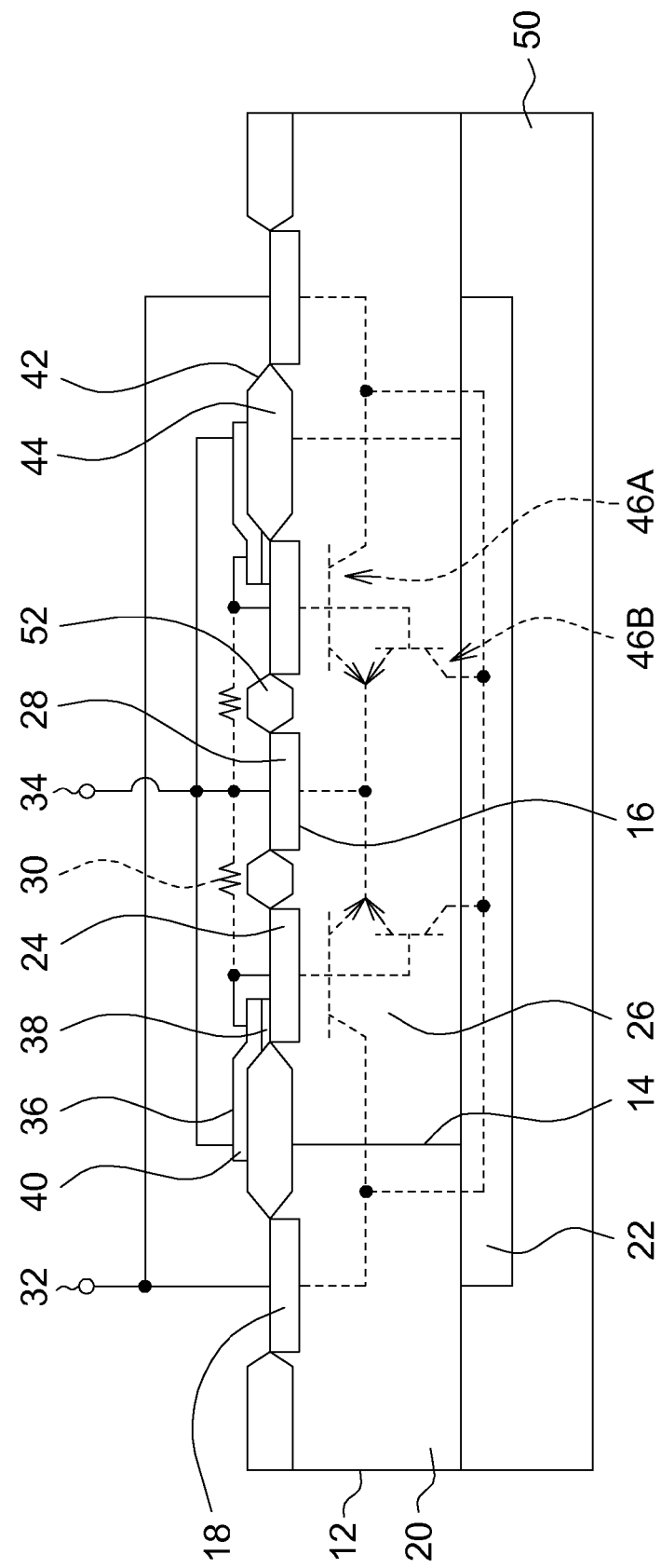
FIG. 2 illustrates a cross-section view of a semiconductor structure in one embodiment.
Figure 3:
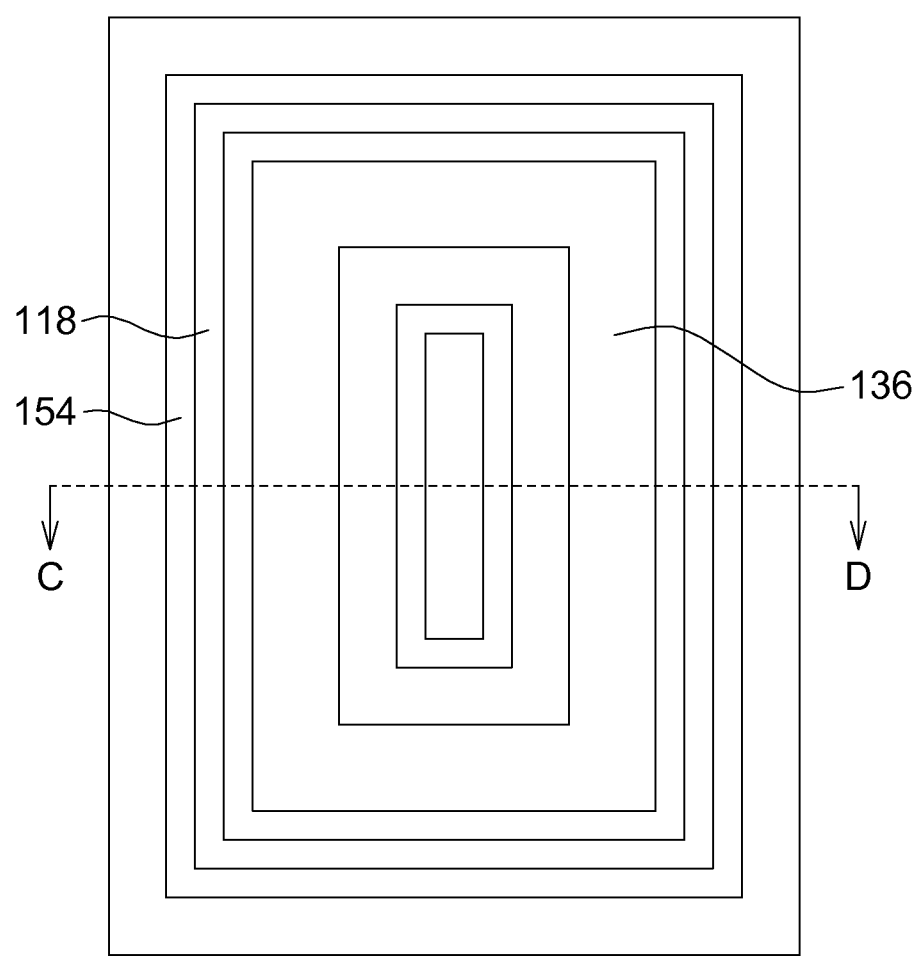
FIG. 3 illustrates a top view of a semiconductor structure in one embodiment.
Figure 4:
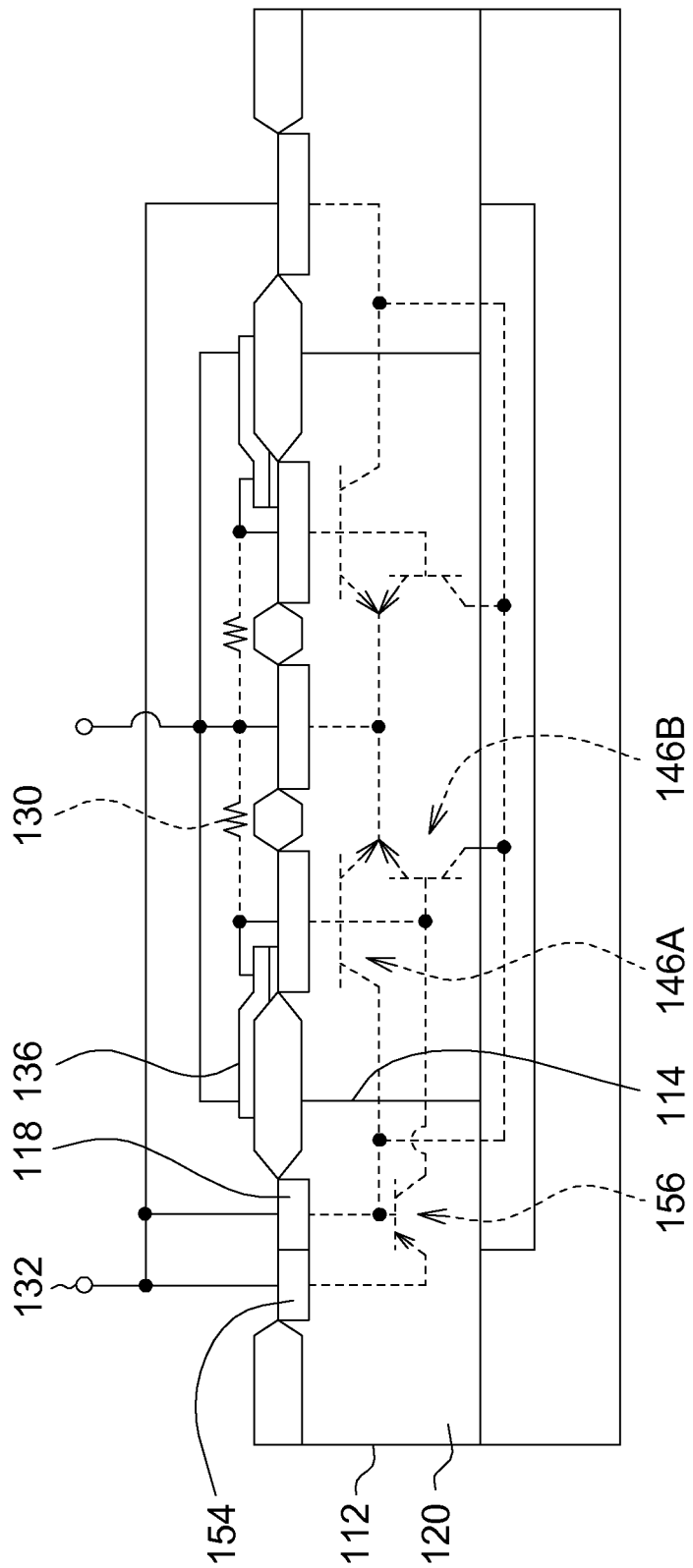
FIG. 4 illustrates a cross-section view of a semiconductor structure in one embodiment.
Figure 5:
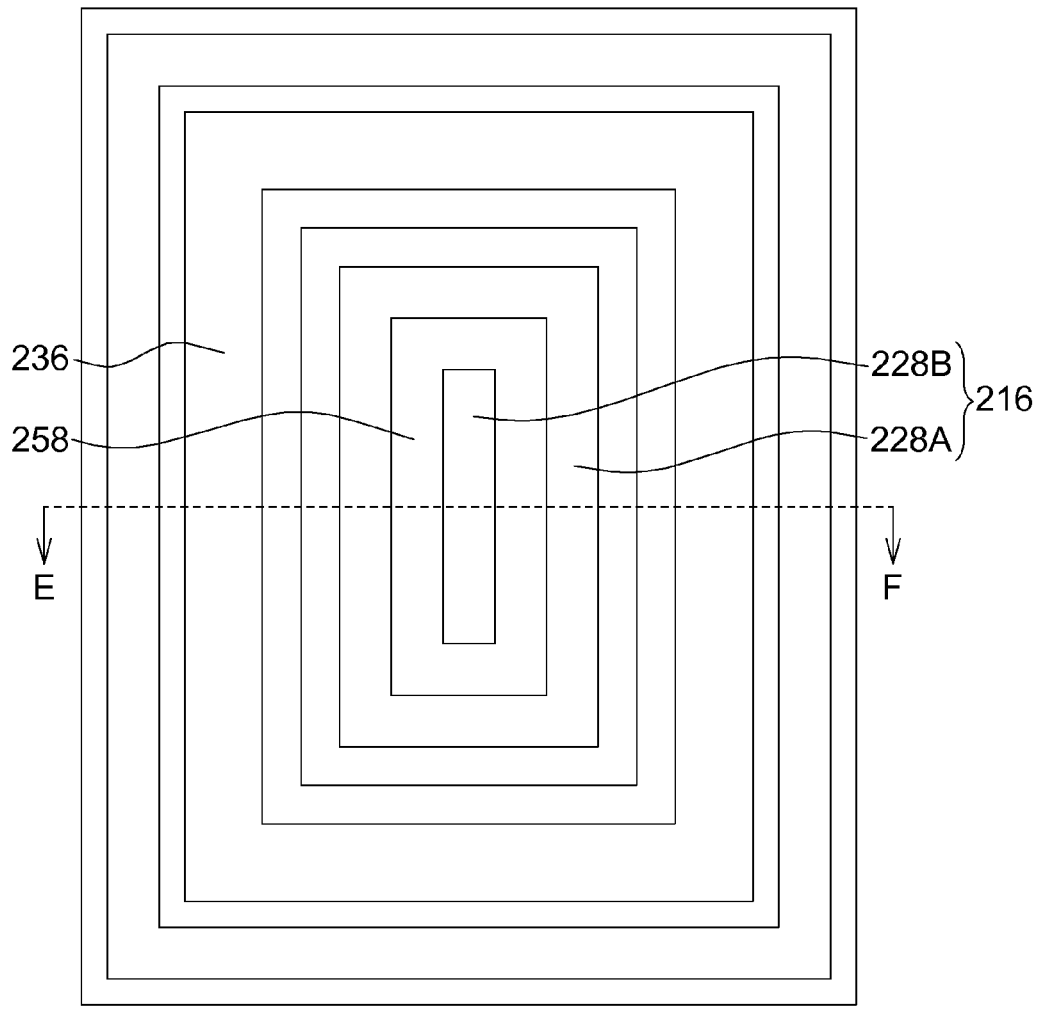
FIG. 5 illustrates a top view of a semiconductor structure in one embodiment.
Figure 6:
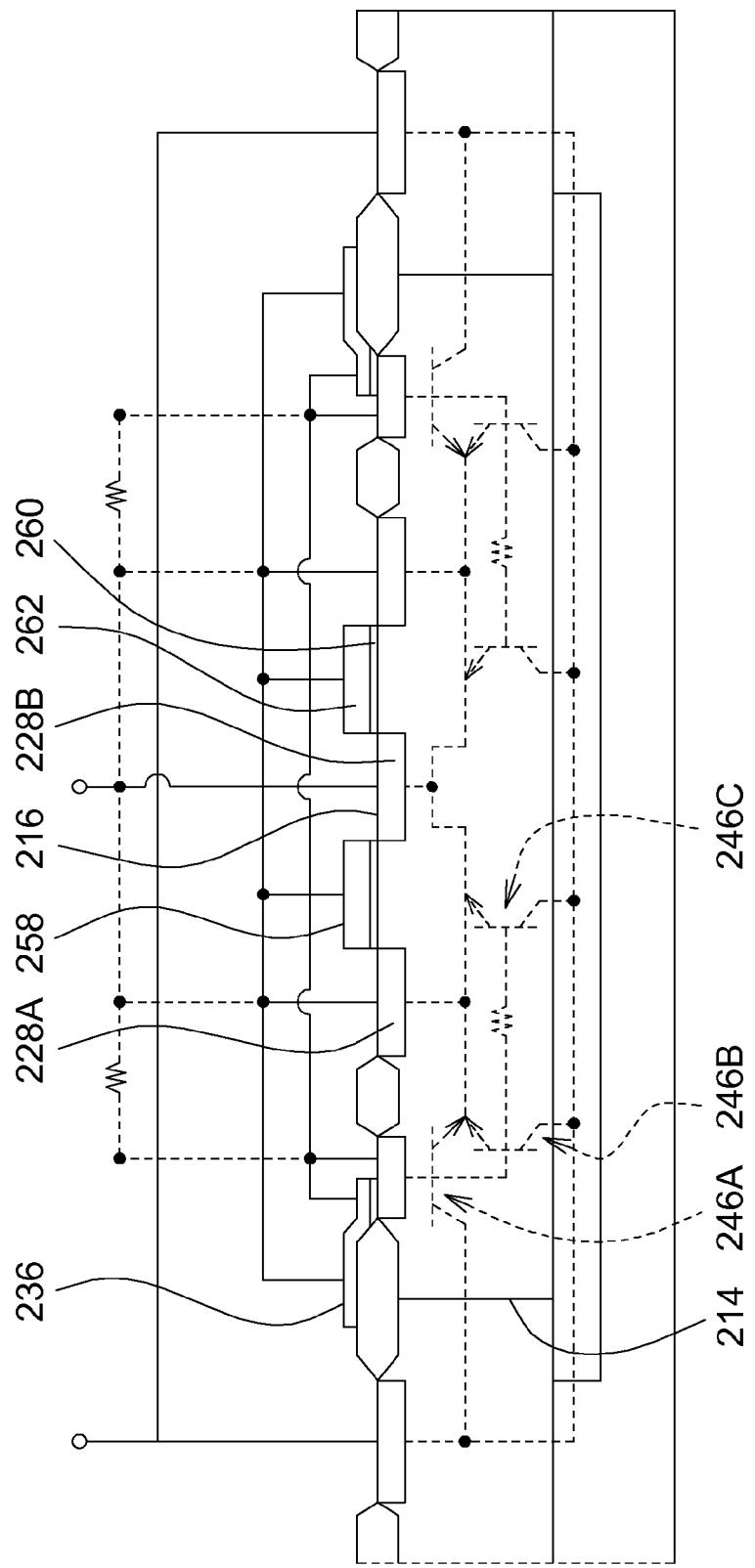
FIG. 6 illustrates a cross-section view of a semiconductor structure in one embodiment.
Figure 7:
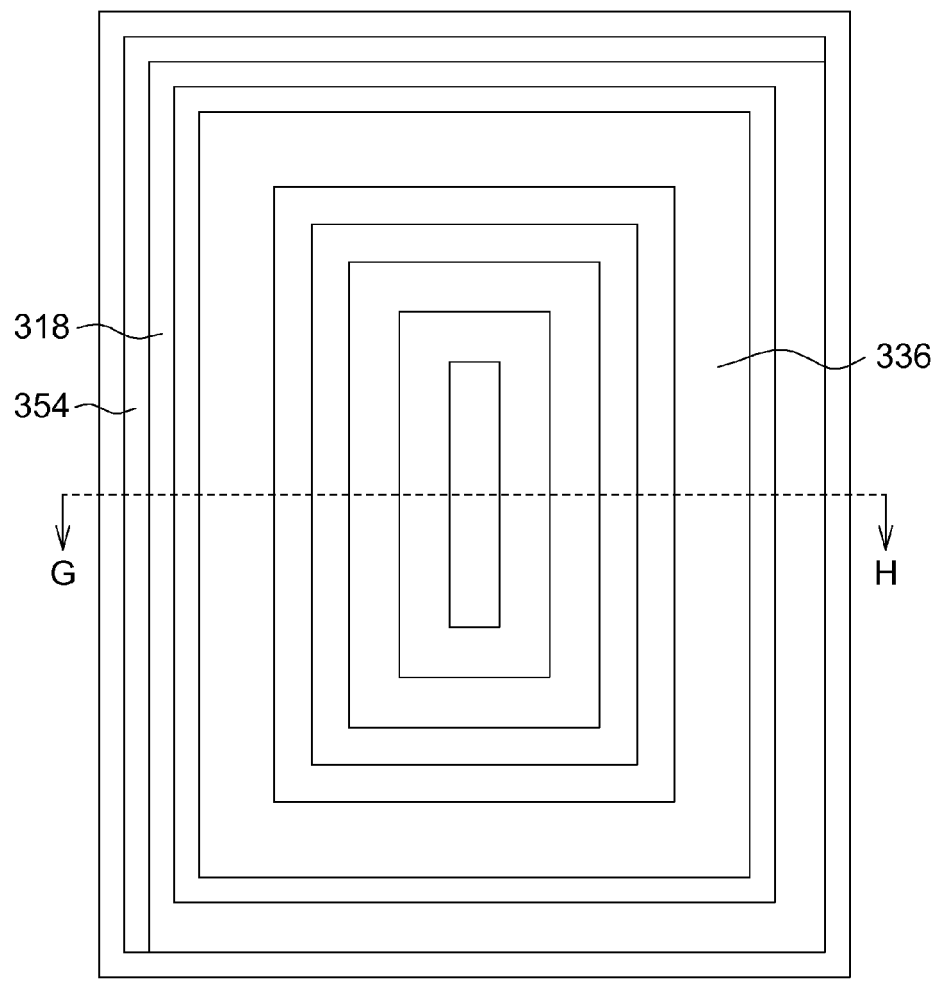
FIG. 7 illustrates a top view of a semiconductor structure in one embodiment.
Figure 8:
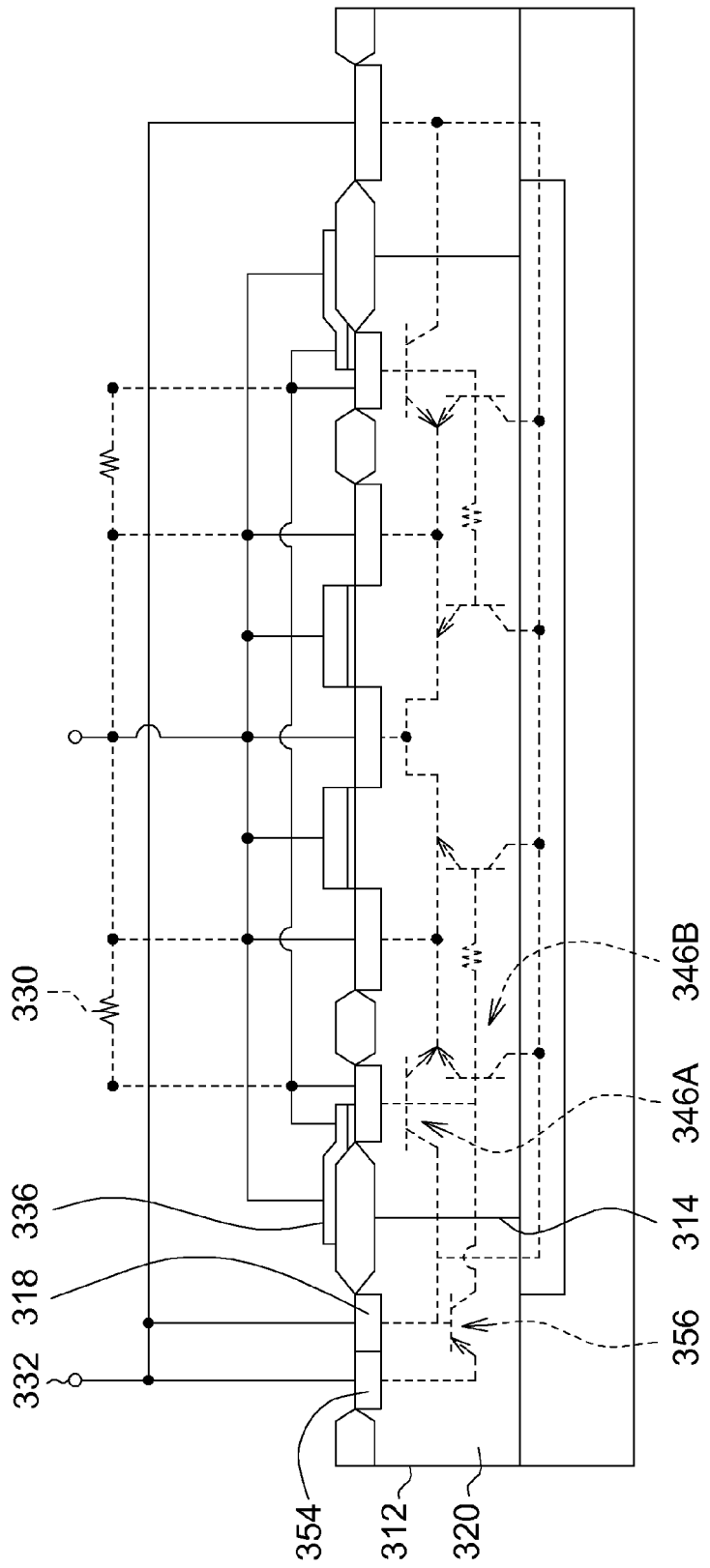
FIG. 8 illustrates a cross-section view of a semiconductor structure in one embodiment.
Figure 9:
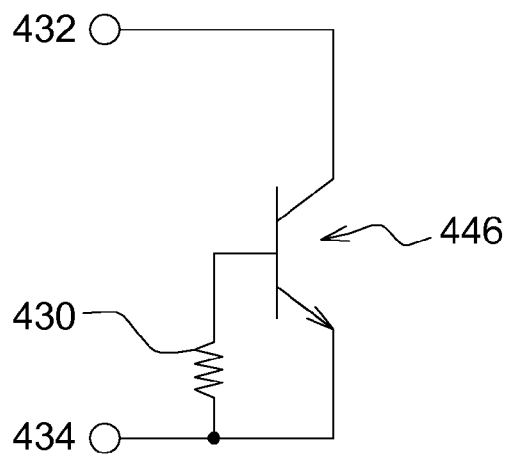
FIG. 9 illustrates an equivalent circuit of a semiconductor structure in one embodiment.
Figure 10:
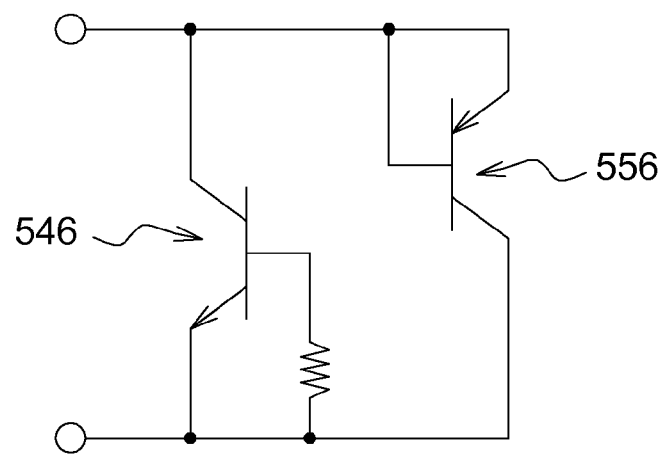
FIG. 10 illustrates an equivalent circuit of a semiconductor structure in one embodiment.

FIG. 1 illustrates a top view of a semiconductor structure in one embodiment. FIG. 2 illustrates a cross-section view of the semiconductor structure drawn along AB line in FIG. 1. FIG. 3 illustrates a top view of the semiconductor structure in one embodiment. FIG. 4 illustrates a cross-section view of the semiconductor structure drawn along CD line in FIG. 3. FIG. 5 illustrates a top view of the semiconductor structure in one embodiment. FIG. 6 illustrates a cross-section view of the semiconductor structure drawn along EF line in FIG. 5. FIG. 7 illustrates a top view of the semiconductor structure in one embodiment. FIG. 8 illustrates a cross-section view of the semiconductor structure drawn along GH line in FIG. 7. FIG. 9 and FIG. 10 illustrate equivalent circuits of the semiconductor structure according to embodiments.

Referring to FIG. 2, the semiconductor structure comprises a first doped region 12, a second doped region 14 and a third doped region 16. The first doped region 12 may comprise a doped portion 18, a doped portion 20 and a doped portion 22 having a first type conductivity such as N type conductivity. The second doped region 14 may comprise a doped portion 24 and a doped portion 26 having a second type conductivity such as P type conductivity. The third doped region 16 may comprise a doped portion 28 having the first type conductivity such as N type conductivity. The first doped region 12 and the third doped region 16 are separated by the second doped region 14.

In one embodiment, the first doped region 12 and the second doped region 14 are formed on a substrate layer 50. The substrate layer 50 may be a bulk material such as silicon, or formed by a doping method or an epitaxial method. The doped portion 22 of the first doped region 12 is formed on the substrate layer 50. The doped portion 22 may be formed by a doping method or an epitaxial method. The doped portion 22 may be a buried layer, a deep well, or a stacked structure having multi layers. The doped portion 20 of the first doped region 12 and the doped portion 26 of the second doped region 14 may be respectively formed by doping a substrate with using a patterned mask layer (not shown). The doped portion 18 of the first doped region 12 may be formed by doping the doped portion 20 with using a patterned mask layer (not shown). The doped portion 24 of the second doped region 14 and the doped portion 28 of the third doped region 16 may be respectively formed by doping the doped portion 26 with using a patterned mask layer (not shown). The doped portion 18, the doped portion 22, the doped portion 24 and the doped portion 28 may be heavily doped. In other embodiments, the doped portion 22 is omitted.

The dielectric structure 42 is formed on the first doped region 12 and the second doped region 14. The dielectric structure 42 may comprise a first dielectric portion 44 and a second dielectric portion 52. The first dielectric portion 44 may be formed on the first doped region 12 and the second doped region 14. The second dielectric portion 52 may be formed on the second doped region 14. The first dielectric portion 44 and the second dielectric portion 52 are not limited to LOCOS as shown in FIG. 2, and may be STI. For example, the first dielectric portion 44 and the second dielectric portion 52 may comprise an oxide such as silicon oxide.

A field plate structure 36 is formed on the second doped region 14 and the first dielectric portion 44. The field plate structure 36 may comprise a dielectric layer 38 and a conductive layer 40 formed on the dielectric layer 38. The conductive layer 40 may comprise a metal, a polysilicon or a silicide. In one embodiment, the conductive layer 40 may be formed by a polysilicon of a single layer or multi layers. In another embodiment, the conductive layer 40 is a stacked structure formed by various materials.

In one embodiment, as shown in FIG. 2, the field plate structure 36 is coupled to the second doped region 14. An anode 32 is coupled to the doped portion 18 of the first doped region 12. A cathode 34 is coupled to the field plate structure 36 and the doped portion 28 of the third doped region 16.

For example, the first doped region 12, the second doped region 14 and the third doped region 16 form first bipolar junction transistors (BJTs) 46A, 46B of a first element type such as NPN BJT. The first doped region 12 functions as a collector of the first BJTs 46A, 46B. The second doped region 14 functions as a base of the first BJTs 46A, 46B. The third doped region 16 functions as an emitter of the first BJTs 46A, 46B.

The resistor 30 is coupled between the doped portion 24 and the doped portion 28. Particularly, the resistor 30 is coupled to a base and an emitter of the first BJTs 46A, 46B. In one embodiment, the resistor 30 may be a parasitic resistor generated due to the field plate structure 36. In other embodiments, the resistor 30 may be formed by other resistor elements.

In one embodiment, the semiconductor structure is used as an ESD device. The resistor 30 coupled to the first BJTs 46A, 46B (or a parasitic resistor generated due to the field plate structure 36) can be used for providing a HV ESD. A trigger voltage of the semiconductor structure can be adjusted by the field plate structure 36. Using the field plate structure 36 can increase an operating voltage and a breakdown voltage of the semiconductor structure. The breakdown voltage and the trigger voltage of the semiconductor structure can be controlled by adjusting a width of the doped portion 22 of the first doped region 12.

In embodiments, the breakdown voltage of the semiconductor structure is close to the HV device operation voltage. The trigger voltage is lower than the breakdown voltage of the HV device. The holding voltage is high. Therefore, for example, it is easier to avoid latching up for the semiconductor structure of the embodiment than a conventional silicon controlled rectifier (SCR).

In one embodiment, the semiconductor structure may comprise a MOS such as a NMOS or a PMOS, or a field transistor. For example, the first BJTs 46A, 46B can be designed to be a MOS such as a NMOS by other suitable structures. The total design area for the ESD device in embodiments is smaller a conventional ESD device comprising a diode for example, in a condition that the ESD devices have substantially equivalent efficiency. The semiconductor structure is insensitive to routing.

The semiconductor structure can be manufactured by a standard BCD process. Therefore, an additional mask or process is not need. The semiconductor structure of embodiments can be applied to any suitable process and operation voltage (HV or LV device), such as a general DC circuit operation.

The semiconductor structure as shown in FIG. 4 differs from the semiconductor structure as shown in FIG. 2 in that, the second doped region 114 and a fourth doped region 154 are separated by the first doped region 112. The fourth doped region 154 has the second type conductivity such as P type conductivity. In one embodiment, the fourth doped region 154 may be formed by doping the doped portion 120 of the first doped region 112 with using a patterned mask layer (not shown), and adjacent to the doped portion 118 of the first doped region 112. The anode 132 is coupled to the fourth doped region 154. The fourth doped region 154 may be heavily doped.

Referring to FIG. 4, the fourth doped region 154, the first doped region 112 and the second doped region 114 form a second BJT 156 of a second element type such as a PNP BJT. The fourth doped region 154 functions as an emitter of the second BJT 156. The first doped region 112 functions as a base of the second BJT 156. The second doped region 114 functions as a collector of the second BJT 156. The first BJTs 146A, 146B are electrically connected to the second BJT 156 in parallel. One end of the resistor 130 is coupled to a base of the first BJTs 146A, 146B. Another end of the resistor 130 is coupled between the emitter of the first BJTs 146A, 146B and the collector of the second BJT 156.

In one embodiment, the semiconductor structure is used as an ESD device. The resistor 130, coupled to the first BJTs 146A, 146B, the second BJT 156, or a parasitic resistor generated due to the field plate structure 136, and the first BJTs 146A, 146B and the second BJT 156 electrically connected in parallel can provide a HV ESD protection. The first BJTs 146A, 146B and the second BJT 156 are incorporated into one ESD device. Therefore, the metal wiring and the ESD device layout area are reduced.

In one embodiment, the semiconductor structure may comprise MOSs or field transistors having opposite element types such as an NMOS and a PMOS. For example, the first BJTs 146A, 146B may be designed to be one kind of MOS such as a NMOS and the second BJT 156 may be designed to be another kind of MOS such as a PMOS by using other structures.

The semiconductor structure as shown in FIG. 6 differs from the semiconductor structure as shown in FIG. 2 in that the third doped region 216 comprises a doped portion 228A and a doped portion 228B having the first type conductivity such as N type conductivity and separated from each other.

A separator structure 258 is formed on the second doped region 214 between the doped portion 228A and the doped portion 228B. In one embodiment, the separator structure 258 may comprise a dielectric layer 260 and a conductive layer 262 formed on the dielectric layer 260. The conductive layer 262 may comprise a metal, a polysilicon or a silicide. In one embodiment, the conductive layer 262 is formed by a polysilicon, and the separator structure 258 and the field plate structure 236 form resistors electrically connected in parallel. A trigger voltage of the semiconductor structure can be adjusted by the separator structure 258.

Using the separator structure 258 and the doped portion 228A and the doped portion 228B separated by the separator structure 258 results in a multi-emitter BJT, comprising the first BJTs 246A, 246B, 246C. In embodiments, the semiconductor structure can be early turned on by an additional bias to the separator structure 258 or the base.

The semiconductor structure as shown in FIG. 8 differs from the semiconductor structure as shown in FIG. 6 in that the second doped region 314 and the fourth doped region 354 are separated by the first doped region 312. The fourth doped region 354 has the second type conductivity such as P type conductivity. In one embodiment, the fourth doped region 354 is formed by doping the doped portion 320 of the first doped region 312 with using a patterned mask layer (not shown), and adjacent to the doped portion 318 of the first doped region 312. The anode 332 is coupled to the fourth doped region 354. The fourth doped region 354 may be heavily doped.

Referring to FIG. 8, the fourth doped region 354, the first doped region 312 and the second doped region 314 form a second BJT 356 of a second element type such as a PNP BJT. The fourth doped region 354 functions as an emitter of the second BJT 356. The first doped region 312 functions as a base of the second BJT 356. The second doped region 314 functions as a collector of the second BJT 356. The first BJTs 346A, 346B are electrically connected to the second BJT 356 in parallel. One end of the resistor 330 is coupled to a base of the first BJTs 346A, 346B. Another end of the resistor 330 is coupled between the emitter of the first BJTs 346A, 346B and the collector of the second BJT 356.

In one embodiment, the semiconductor structure is used as an ESD device. The resistor 330, coupled to the first BJTs 346A, 346B, the second BJT 356, or a parasitic resistor generated due to the field plate structure 336, and the first BJTs 346A, 346B and the second BJT 356 electrically connected in parallel can provide a HV ESD protection. The first BJTs 346A, 346B and the second BJT 356 are incorporated into one ESD device. Therefore, the metal wiring and the ESD device layout area are reduced.

In one embodiment, the semiconductor structure may comprise MOSs or field transistors having opposite element types such as an NMOS and a PMOS. For example, the first BJTs 346A, 346B may be designed to be one kind of MOS such as a NMOS and the second BJT 356 may be designed to be another kind of MOS such as a PMOS by using other structures.

In embodiments, the semiconductor structure can be used as an ESD device, having circuits as shown in FIG. 9 and FIG. 10. Referring to FIG. 9, the resistor 430 is coupled between the base and the emitter of the first BJT 446. The anode 432 and the cathode 434 are respectively coupled to the base and the emitter of the first BJT 446. The circuit as shown in FIG. 10 differs from the circuit as shown in FIG. 9 in that the resistor 430 is coupled to a node between the emitter of the first BJT 546 and the collector of the second BJT 556.

According to embodiments of the present disclosure, the semiconductor structure has at least following advantages. The resistor (or the parasitic resistor generated due to the field plate structure) coupled to the BJT, and the first BJT and the second BJT electrically connected in parallel can help to provide a HV ESD protection. The separator structure can be used for adjusting a trigger voltage or increasing an operation voltage and a breakdown voltage of the semiconductor structure. A width of the doped region used as the buried layer of the first doped region can be adjusted for controlling the breakdown voltage and the trigger voltage of the semiconductor structure. Using the separator structure and the third doped regions separated from each other can result in a multi-emitter BJT. The semiconductor structure can be early turned on by an additional bias to the separator structure or the base.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a first doped region having a first type conductivity;
    a second doped region having a second type conductivity opposite to the first type conductivity;
    a third doped region having the first type conductivity, wherein the first doped region and the third doped region are separated by the second doped region;
    a resistor coupled between the second doped region and the third doped region, wherein an anode is coupled to the first doped region, a cathode is coupled to the third doped region;
    a dielectric layer on the second doped region;
    a dielectric structure comprising a first dielectric portion thicker than the dielectric layer, wherein the first doped region and the second doped region have a substantial vertical PN junction therebetween, the substantial vertical PN junction is wholly under the first dielectric portion; and
    a field plate structure on the dielectric layer and the first dielectric portion.

2. The semiconductor structure according to claim 1, wherein the field plate structure is on the second doped region.

3. The semiconductor structure according to claim 2, wherein the field plate structure comprises a conductive layer on the second doped region.

4. The semiconductor structure according to claim 3, wherein the conductive layer comprises a metal, a polysilicon or a silicide.

5. The semiconductor structure according to claim 2, wherein the resistor is generated due to the field plate structure.

6. The semiconductor structure according to claim 2, wherein the first dielectric portion is between the second doped region and the field plate structure.

7. The semiconductor structure according to claim 2, wherein the field plate structure is coupled to the second doped region.

8. The semiconductor structure according to claim 2, wherein the cathode is coupled to the field plate structure.

9. The semiconductor structure according to claim 1, wherein the first doped region, the second doped region and the third doped region form a first bipolar junction transistor (BJT).

10. The semiconductor structure according to claim 9, wherein the resistor is coupled between a base and an emitter of the first BJT.

11. The semiconductor structure according to claim 9, wherein the first doped region functions as a collector of the first BJT, the second doped region functions as a base of the first BJT, the third doped region functions as an emitter of the first BJT.

12. The semiconductor structure according to claim 1, further comprising a fourth doped region having the second type conductivity, wherein the second doped region and the fourth doped region are separated by the first doped region.

13. The semiconductor structure according to claim 12, wherein the anode is coupled to the fourth doped region.

14. The semiconductor structure according to claim 12, wherein the first doped region, the second doped region and the third doped region form a first BJT, the fourth doped region, the first doped region and the second doped region form a second BJT, one of the first BJT and the second BJT is an NPN BJT, the other of the first BJT and the second BJT is a PNP BJT.

15. The semiconductor structure according to claim 14, the first BJT and the second BJT are electrically connected in parallel.

16. The semiconductor structure according to claim 14, wherein one end of the resistor is coupled to a base of the first BJT, another end of the resistor is coupled to a node between an emitter of the first BJT and a collector of the second BJT.

17. The semiconductor structure according to claim 1, further comprising a separator structure, wherein the third doped region comprises a first doped portion and a second doped portion having the first type conductivity, the separator structure is on the second doped region between the first doped portion and the second doped portion.

18. The semiconductor structure according to claim 17, wherein the separator structure comprises a conductive layer on the second doped region between the first doped portion and the second doped portion.

* * * * *